(12) United States Patent
Lee et al.

(10) Patent No.: US 11,990,424 B2
(45) Date of Patent: May 21, 2024

(54) SELECTIVE EMI SHIELDING USING PREFORMED MASK

(71) Applicant: STATS ChipPAC Pte. Ltd., Singapore (SG)

(72) Inventors: HunTeak Lee, Gyeongi-do (KR); KyungHwan Kim, Incheon (KR); HeeSoo Lee, Kyunggi-do (KR); ChangOh Kim, Incheon (KR); KyoungHee Park, Seoul (KR); JinHee Jung, Incheon (KR); OMin Kwon, Gyeonggi-do (KR); JiWon Lee, Seoul (KR); YuJeong Jang, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 18/303,308

(22) Filed: Apr. 19, 2023

(65) Prior Publication Data
US 2023/0275034 A1    Aug. 31, 2023

Related U.S. Application Data

(63) Continuation of application No. 16/950,295, filed on Nov. 17, 2020, now Pat. No. 11,664,327.

(51) Int. Cl.
*H01L 23/552* (2006.01)
*H01L 21/56* (2006.01)
*H01L 23/498* (2006.01)

(52) U.S. Cl.
CPC .......... *H01L 23/552* (2013.01); *H01L 21/56* (2013.01); *H01L 21/561* (2013.01); *H01L 21/568* (2013.01); *H01L 23/49822* (2013.01)

(58) Field of Classification Search
CPC ..... H01L 23/552; H01L 21/56; H01L 21/561; H01L 23/3121; H01L 2224/16227; H01L 23/66
(Continued)

(56) References Cited

U.S. PATENT DOCUMENTS 6,818,539 B1 * 11/2004 Kanda .................... H01L 24/03
                                                    257/E23.021
9,332,646 B2    5/2016 Chen et al.
(Continued)

FOREIGN PATENT DOCUMENTS

CN      107564891 A     1/2018
CN      111326428 A     6/2020
(Continued)

*Primary Examiner* — Didarul A Mazumder
(74) *Attorney, Agent, or Firm* — Brian M. Kaufman; Robert D. Atkins; PATENT LAW GROUP: Atkins and Associates, P.C.

(57) ABSTRACT

A semiconductor package has a substrate, a first component disposed over the substrate, an encapsulant deposited over the first component, and a second component disposed over the substrate outside the encapsulant. A metal mask is disposed over the second component. A shielding layer is formed over the semiconductor package. The metal mask after forming the shielding layer. The shielding layer is optionally formed on a contact pad of the substrate while a conic area above the contact pad that extends 40 degrees from vertical remains free of the encapsulant and metal mask while forming the shielding layer. Surfaces of the metal mask and encapsulant oriented toward the contact pad can be sloped. The metal mask can be disposed and removed using a pick-and-place machine.

22 Claims, 14 Drawing Sheets

(58) Field of Classification Search
USPC .......................................................... 257/659
See application file for complete search history.

(56) References Cited

U.S. PATENT DOCUMENTS

| | | | |
|---|---|---|---|
| 10,834,825 | B1 | 11/2020 | Bedinger |
| 2004/0113253 | A1 | 6/2004 | Karnezos |
| 2011/0261550 | A1 | 10/2011 | Wong et al. |
| 2011/0291250 | A1 | 12/2011 | Chen |
| 2012/0094442 | A1 | 4/2012 | Lin et al. |
| 2013/0037923 | A1 | 2/2013 | Yoo |
| 2014/0126161 | A1* | 5/2014 | Chen .................. H01L 23/552 361/748 |
| 2014/0192464 | A1* | 7/2014 | Astle .................. H05K 1/181 361/679.01 |
| 2016/0319422 | A1 | 11/2016 | Kurita et al. |
| 2017/0077039 | A1 | 3/2017 | Liao et al. |
| 2017/0358540 | A1* | 12/2017 | Min .................... H01L 23/295 |
| 2018/0005957 | A1 | 1/2018 | Vincent et al. |
| 2018/0033738 | A1 | 2/2018 | Kawabata et al. |
| 2018/0096948 | A1* | 4/2018 | Kim .................. H01L 21/67092 |
| 2018/0182715 | A1 | 6/2018 | Kim et al. |
| 2019/0067050 | A1* | 2/2019 | Jang .................. H01L 21/4853 |
| 2019/0074236 | A1* | 3/2019 | Fuku .................. H01L 24/32 |
| 2020/0075502 | A1 | 3/2020 | Kim et al. |
| 2020/0194379 | A1 | 6/2020 | Kim et al. |
| 2020/0211976 | A1 | 7/2020 | Kim et al. |
| 2020/0211977 | A1 | 7/2020 | Kim et al. |

FOREIGN PATENT DOCUMENTS

| | | |
|---|---|---|
| CN | 111383925 A | 7/2020 |
| KR | 20160111962 A | 9/2016 |
| KR | 20180077028 A | 7/2018 |
| TW | 200416787 A | 9/2004 |

* cited by examiner

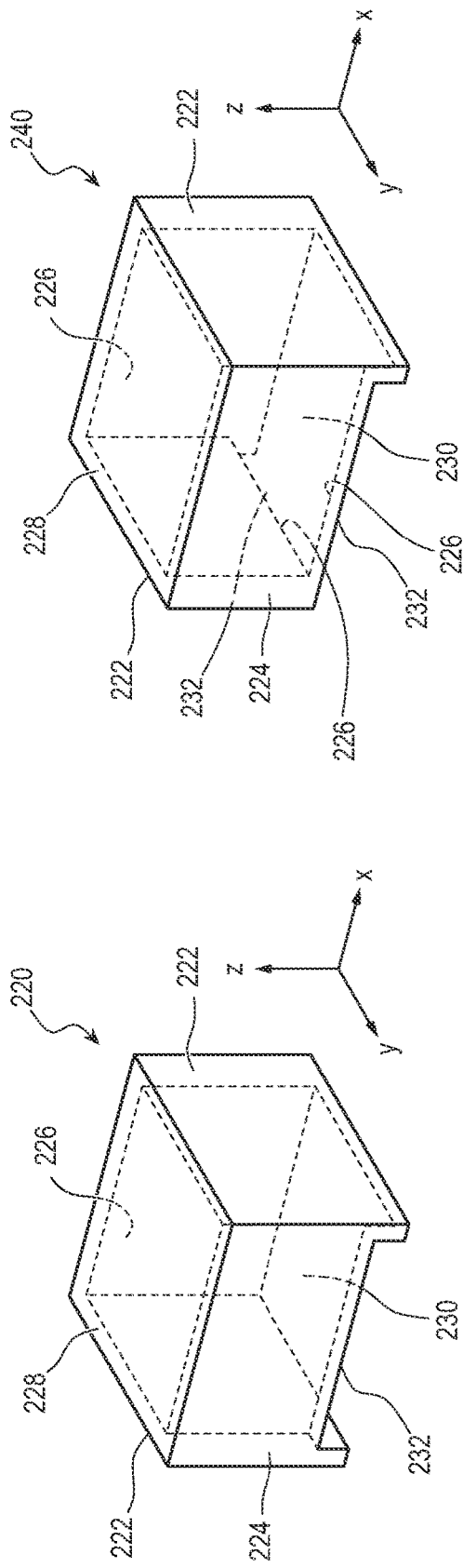
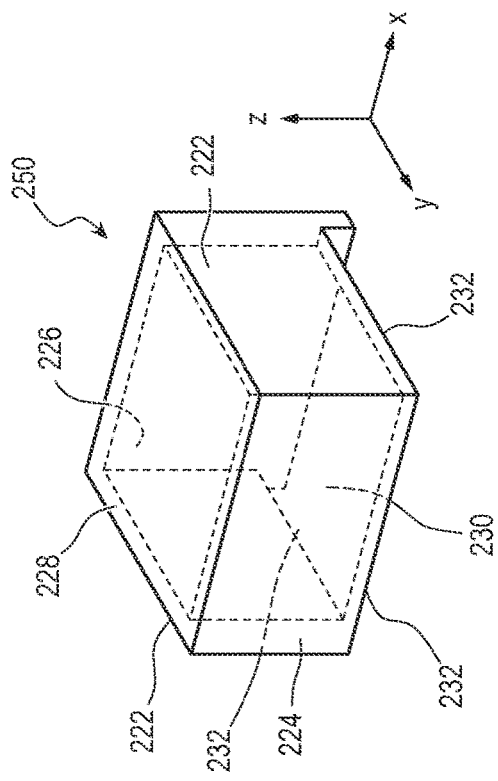
FIG. 2e
FIG. 2f
FIG. 2g

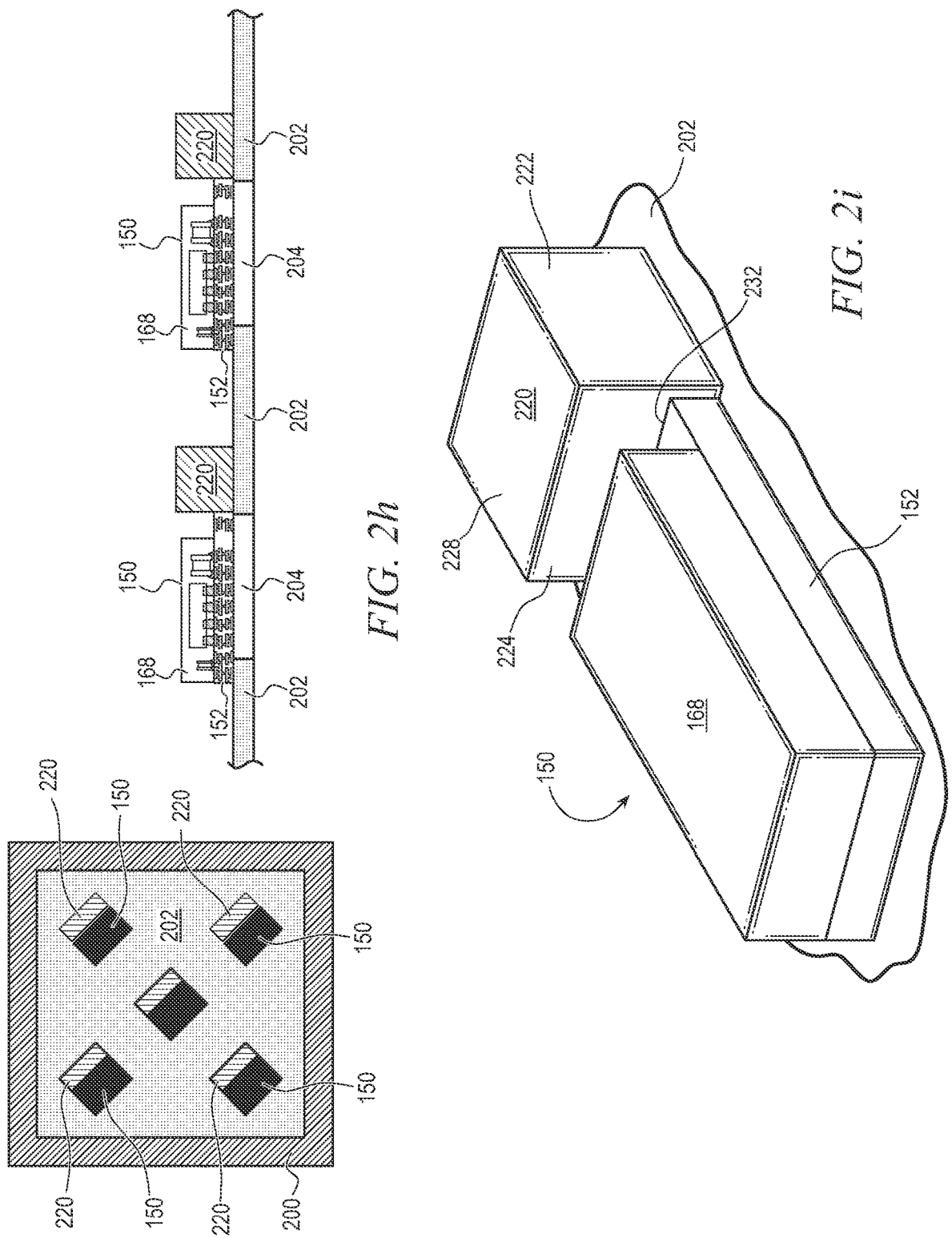

SELECTIVE EMI SHIELDING USING PREFORMED MASK

CLAIM TO DOMESTIC PRIORITY

The present application is a continuation of U.S. patent application Ser. No. 16/950,295, now U.S. Pat. No. 11,664,327, filed Nov. 17, 2020, which application is incorporated herein by reference.

FIELD OF THE INVENTION

The present invention relates in general to semiconductor manufacturing and, more particularly, to a semiconductor device and method for forming selective electromagnetic interference (EMI) shielding using preformed masks.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

Conductive layers are commonly formed over semiconductor packages to shield electronic parts within the package from EMI and other interference. Shielding layers absorb EMI before the signals can hit semiconductor die and discrete components within the package, which might otherwise cause malfunction of the device. Shielding layers are also formed over packages with components that are expected to generate EMI to protect nearby devices.

One problem with prior methods of semiconductor package shielding is that forming the shielding layer over a package completely covers the top of the package. Many semiconductor packages need open areas with exposed sockets or terminals that allow connection to adjacent semiconductor devices. Unfortunately, traditional shielding completely covers the packages and would short circuit any exposed terminals, sockets, or other exposed components. Tape masks have been used to form partially shielded packages. However tape masks have a complex process requirements to laminate the mask and then peel the mask after sputtering. Therefore, a need exists for semiconductor devices with selectively formed EMI shielding.

BRIEF DESCRIPTION OF THE DRAWINGS

FIGS. 2a-2m illustrate selectively forming a shielding layer using a preformed mask;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices. The terms "die" and "semiconductor die" are used interchangeably.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, wirebonds, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
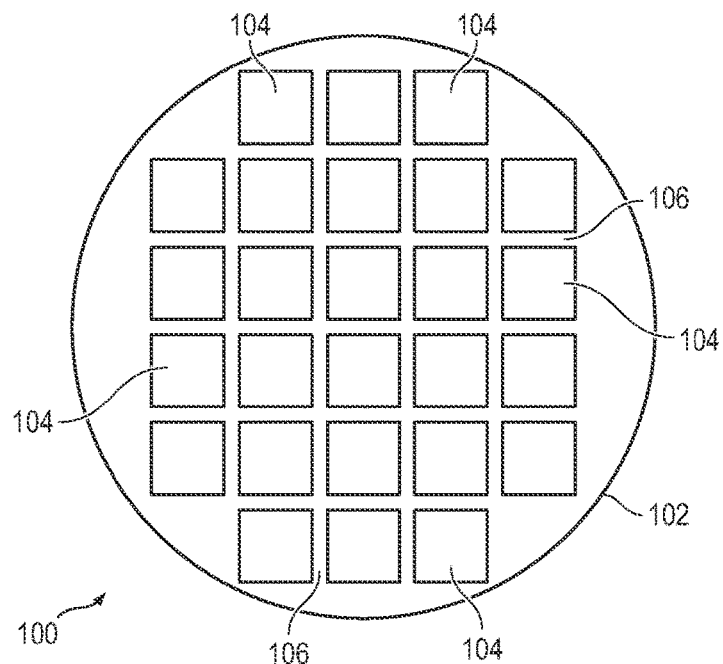
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
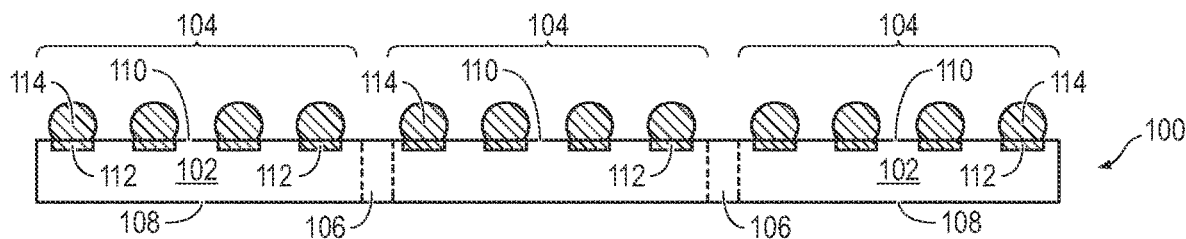

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1b. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

Figure 1C:
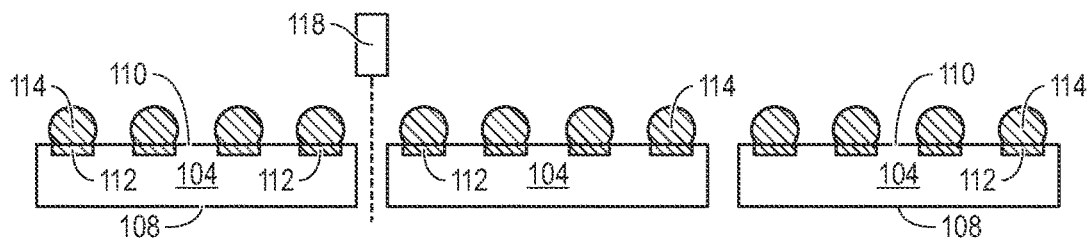

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

Figure 2A:
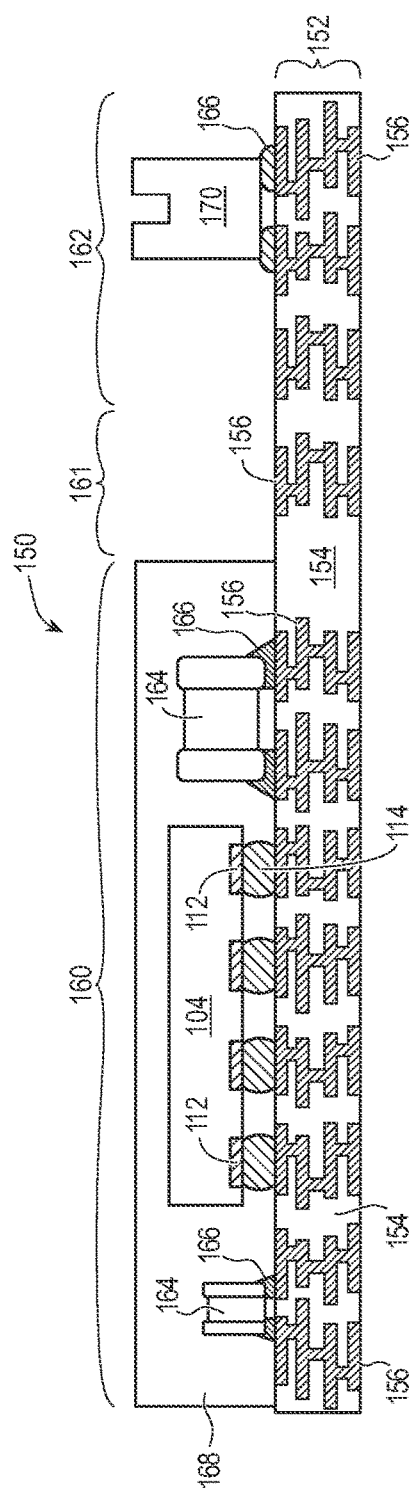

FIG. 2a illustrates a cross-section of an exemplary semiconductor package 150 prior to selectively forming a shielding layer. Semiconductor package 150 is a system-in-package (SiP) device in some embodiments. Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side or both sides of substrate 152. Any suitable type of substrate or leadframe is used for substrate 152 in other embodiments.

Any components desired to be shielded in semiconductor package 150 are mounted to or disposed over substrate 152 within shielding region 160 and electrically connected to conductive layers 156. A shielding interface area 161 is provided for connection of the subsequently formed shielding layer to conductive layer 156. A non-shielding area 162 contains other components not intended to be shielded. FIG. 2a illustrates semiconductor die 104 mounted on substrate 152 along with discrete electrical components 164 within shielding region 160 as an example. Discrete components 164 can be passive components such as capacitors, resistors, or inductors, active components such as diodes or transistors, or any other desired electrical component.

Semiconductor die 104 is mounted to substrate 152 by disposing the semiconductor die on the substrate using, e.g., a pick-and-place process or machine, and then reflowing bumps 114 to physically and electrically connect the bumps to exposed contact pads of conductive layer 156. Discrete components 164 are connected by similar solder bumps or solder paste 166. Solder paste 166 can be printed onto substrate 152 or discrete components 164 prior to picking and placing the discrete components onto the substrate. Reflowing solder paste 166 physically and electrically couples discrete components 164 to contact pads of conductive layer 156.

After mounting of semiconductor die 104, discrete components 164, and any other desired electrical components onto substrate 152 within shielding area 160, the components are encapsulated by encapsulant or molding compound 168. Encapsulant 168 is deposited over substrate 152, semiconductor die 104, and discrete components 164 using paste printing, compressive molding, transfer molding, liquid encapsulant molding, vacuum lamination, spin coating, or another suitable applicator. Encapsulant 168 can be polymer composite material, such as epoxy resin, epoxy acrylate, or polymer with or without a filler. Encapsulant 168 is non-conductive, provides structural support, and environmentally protects the semiconductor device from external elements and contaminants. A mask or other mechanism can be used to prevent encapsulant 168 from covering shielding interface area 161 and non-shielding area 162. In other embodiments, encapsulant 168 is deposited over shielding interface area 161 and non-shielding area 162 and then removed.

Any electrical components that are desired to be left unshielded are disposed on or over substrate 152 within non-shielding area 162. Non-shielding area 162 is populated with electrical components after encapsulation with encapsulant 168 to reduce complexity of masking the non-shielding area from being encapsulated. In other embodiments, components can be disposed on substrate 152 in non-shielding area 162 prior to depositing encapsulant 168.

FIG. 2a shows a board-to-board (B2B) connector 170 mounted on substrate 152 in non-shielding region 162. Connector 170 is physically and electrically coupled to conductive layer 156 by solder paste 166. Connector 170 is configured for attachment of an electrical terminal of an electrical cable to the connector. The electrical cable electrically couples package 150 to another adjacent electrical package or device so that semiconductor die 104 can communicate with the other device through connector 170. Other electrical components can be disposed in non-shielding region 162 as desired. The electrical components disposed in non-shielded region 162 can include an antenna disposed on substrate 152 or formed as part of conductive layers 156. In other embodiments, no components are disposed or formed in non-shielding region 162 and contact pads of conductive layer 156 are simply left exposed as a land grid array for electrical interconnection or for addition of electrical components at a later stage.

Figure 2B:
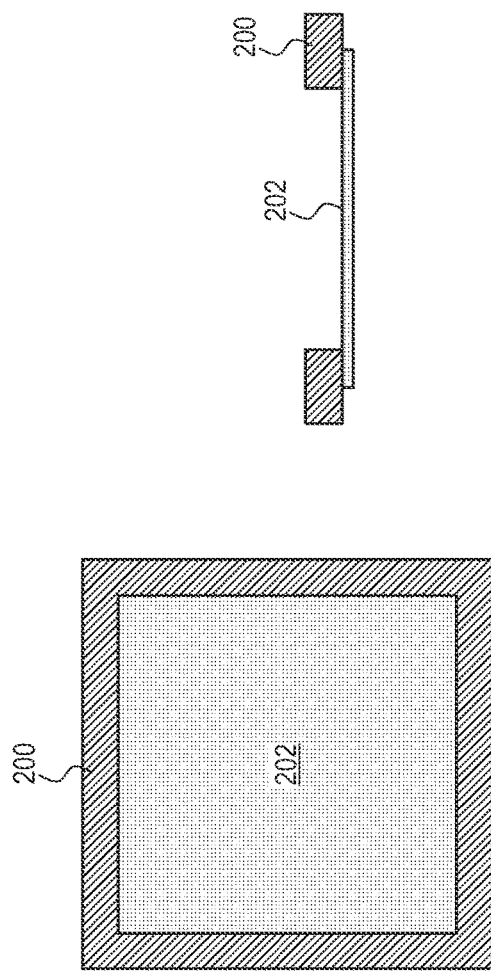
Figure 2C:
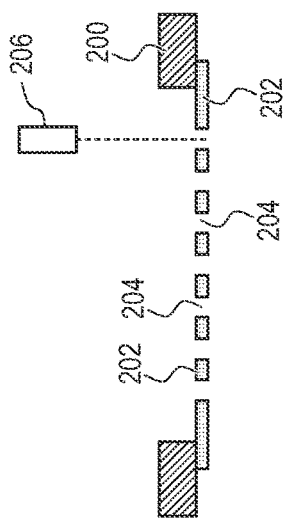
Figure 2C:
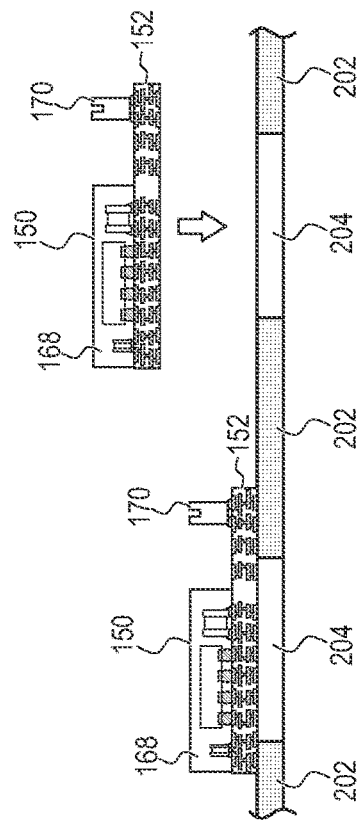
Figure 2C:
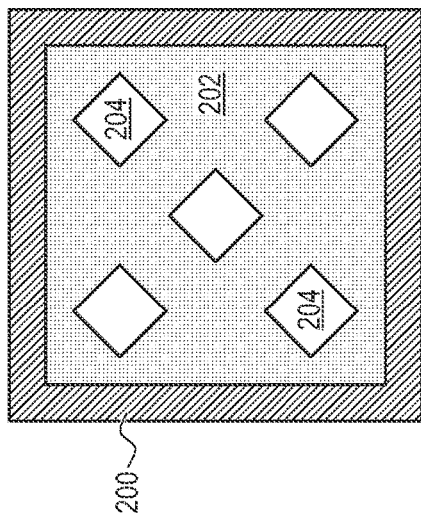
Figure 2D:
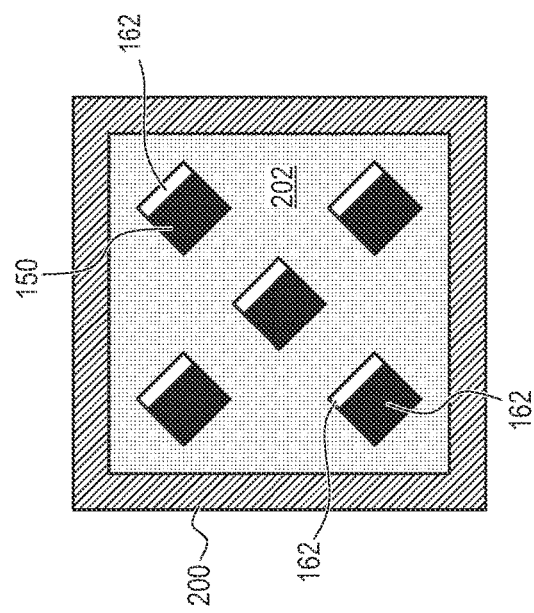

FIG. 2b shows a metal frame 200 and film 202 used as a carrier during formation of a shielding layer over package 150. FIG. 2b includes a top-down view on the left side of the figure and a cross-sectional view on the right side of the figure. FIGS. 2c, 2d, and 2h similarly show both a top-down view and a cross-sectional view of their respective processing steps. Frame 200 can be formed of aluminum, copper, steel, or another suitable metal. Alternatively, frame 200 can be formed from plastic, wood, or any other suitable rigid material. A tape or film 202 is mounted onto frame 200 to form a support base for a plurality of packages 150. Film 202 is formed from polyimide (PI) in one embodiment. Film 202 has an adhesive coated on a surface of the film to allow the film to stick to metal frame 200 and to allow packages 150 to adhere to the film. The adhesive on film 202 can be a thermal or ultraviolet (UV) release adhesive.

In FIG. 2c, a plurality of openings 204 are formed through film 202 using laser cutting tool 206, a mechanical punch, or any other suitable mechanism. Openings 204 are smaller than the footprint of packages 150 to allow the packages to be disposed on film 202 over the openings. Openings 204 facilitate removal of packages 150 from film 202 after forming a shielding layer.

In FIG. 2d, packages 150 are disposed over openings 204 using a pick-and-place process or machine. The bottom of substrate 152 physically contacts film 202 all the way around opening 204 such that each opening 204 is completely covered by a package 150. In one embodiment, the overlap of substrate 152 over film 202 around opening 204 is between 0.1 mm and 0.5 mm on each side of the substrate. In other embodiments, openings 204 extend partially outside of the footprints of packages 150. Adhesive on film 202 sticks packages 140 to the film.

FIG. 2e shows a preformed mask 220 that will be placed over non-shielding area 162 to block a shielding layer from being formed directly on the underlying components. Mask 220 includes sides 222, front 224, back 226, and top 228 that define a mask cavity 230. Each of sides 222, front 224, and back 226 has a height in the Z-axis direction of the illustrated axis. Sides 222 have widths along the Y-axis and thicknesses along the X-axis. Front 224 and back 226 have widths along the X-axis and thicknesses along the Y-axis. Top 228 has a thickness along the Z-axis, a length along the X-axis, and a width along the Y-axis.

Connector 170 is disposed within mask cavity 230 during formation of the shielding layer. Sides 222 and back 228 have heights that are at least as high as the top of connector 170, or the tallest component within non-shielding area 162, over film 202 so that the bottoms of the sides and back can rest on film 202 with top 228 extending over the connector or other component. Front 224 has a bottom lip 232 that is raised higher than the bottoms of sides 222 and back 226 along the Z-axis. The opening under lip 232 provides space for substrate 152 to extend from under mask 220 to outside the mask.

Lip 232 contacts, or nearly contacts, the top surface of substrate 152 while sides 222 and back 224 extend down to surround the end of the substrate with non-shielding area 162. The length of lip 232 along the X-axis is approximately the same or slightly longer than a width of substrate 152 in the same direction so that sides 222 contact or nearly contact the sides of the substrate. The widths of sides 222 are greater than a width of non-shielded region 162 so that back 226 sits just outside a footprint of substrate 152 when lip 232 is placed on the border between shielding interface area 161 and non-shielding area 162. In some embodiments, sides 222 are just wide enough so that back 226 contacts a side surface of substrate 152.

Mask 220 is formed of metal, liquid-crystal polymer (LCP), plastic, polymer, Teflon, glass, rubber, wood, film, tape, foil, combinations thereof, or any other solid material that can withstand the process of forming a shielding layer. Mask 220 is formed by molding, by folding or working a sheet of material into the desired shape, or by any other suitable means.

FIGS. 2f and 2g illustrate alternative embodiments for use when non-shielding area 162 does not occupy an entire side of substrate 152. FIG. 2f shows a mask 240 with lip 232 extending around the corner from front 224 to one side 222, which allows the mask to be disposed on a corner of a substrate. Lip 232 allows substrate 152 to extend out from mask 240 in two directions. FIG. 2g shows a mask 250 with lip 232 extending to both sides 222, which allows the mask to be placed on a side of substrate 152 without extending to any corner of the substrate. Mask 220 is designed to cover an entire side of substrate 152 including two corners of the substrate. Mask 220 is designed to cover only a single corner of substrate 152. Mask 240 is designed to cover only a portion of a side and no corners of substrate 152.

FIGS. 2h and 2i show packages 150 with masks 220 picked and placed over non-shielding areas 162. FIG. 2h shows a top-down and cross-sectional view, while FIG. 2i shows a perspective view. Mask 220 covers non-shielding area 162 and creates a seal sufficient to block metal molecules from being deposited on connector 170 during sputtering of a shielding layer. Shielding area 160 and shielding interface area 161 remain exposed for the formation of a shielding layer over those areas.

Connector 170, a land grid array, or other desired electrical components are disposed within cavity 230 of mask 220. The bottoms of sides 222 and back 226 rest on film 202. Lip 232 on the bottom of front 224 contacts or is slightly above the top surface of substrate 152. Top 228 extends over the top of connector 170. Top 228 can be the same height, taller, or shorter than encapsulant 168. The portion of substrate 152 within non-shielding area 162 extends between sides 222. Sides 222 and back 226 are sized and positioned to contact or nearly contact substrate 152. A significant gap can be present between substrate 152 and sides 222 in other embodiments where sputtering some metal on the sides of the substrate within non-shielding area 162 is inconsequential. A gap between back 226 and substrate 152 will generally be inconsequential to the mask 220 function.

Figure 2J:
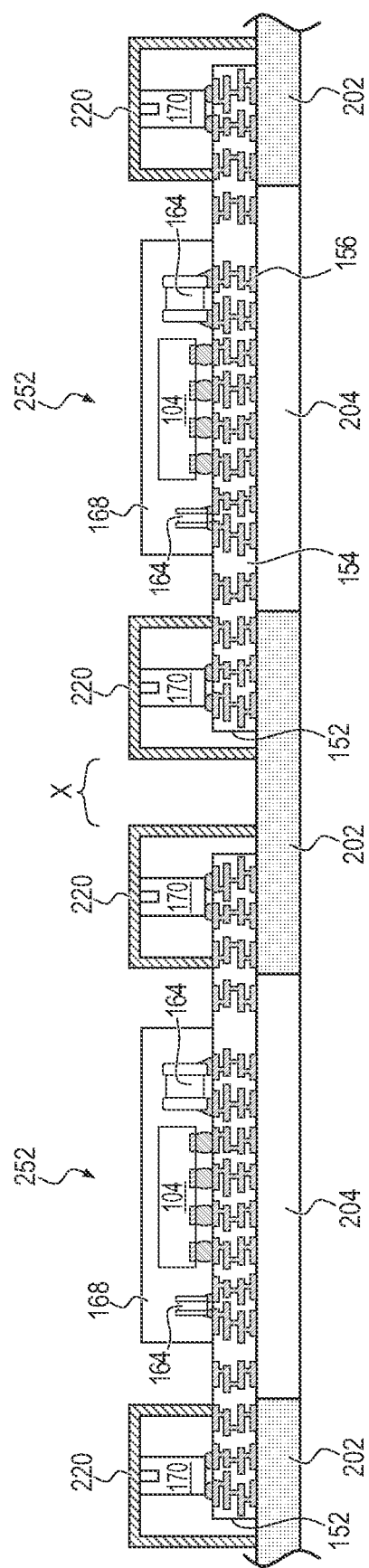

FIG. 2j shows another embodiment where packages 252 have connectors 170 on two opposite sides of substrate 152. Two masks 220 are used per package to mask both connectors 170. When two masks 220 of adjacent packages 252 are disposed directly adjacent to each other, a space 'x' of at least 2 mm is maintained between the masks. Any number of connectors 170 or other components can be used with masks 220 shaped appropriately to cover all of the non-shielded components. Multiple masks are used when the components are disposed in multiple groupings on substrate 152.

Figure 2K:
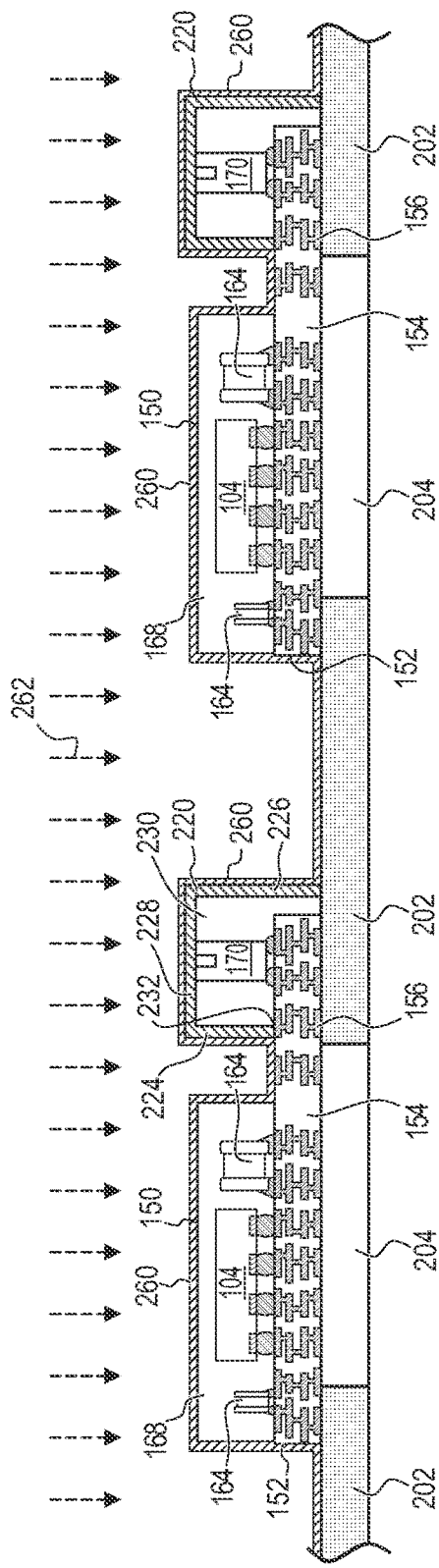

FIG. 2k, continuing from FIGS. 2h and 2i, illustrates a conductive material being sputtered over packages 150, as indicated by arrows 262, to form a shielding layer 260.

Masks 220 are shown in cross-section to illustrate how connector 170 sits in cavity 230. Shielding layer 260 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable shielding layer material. Shielding layer 260 completely covers exposed surfaces of package 150 and mask 220. In particular, all four side surfaces and the top surface of encapsulant 168 are covered by shielding layer 260. Shielding layer 260 covers mask 220, but the sputtered metal does not penetrate the mask. Shielding layer 260 is therefore not formed directly on connector 170. All side surfaces of substrate 152 other than within mask 220 are covered by shielding layer 260.

The top surface of substrate 152 in shielding interface area 161, between encapsulant 168 and mask 220, is covered by shielding layer 260. The top surface of substrate 152 in shielding interface area 161 includes exposed contact pads of conductive layer 156 that shielding layer 260 physically contacts to provide an electrical connection to a ground voltage node. In some embodiments, a portion of conductive layer 156 is exposed at a side surface of substrate 152 so that shielding layer 260 physically contacts the conductive layer on the sides of the substrate as well.

Figure 2L:
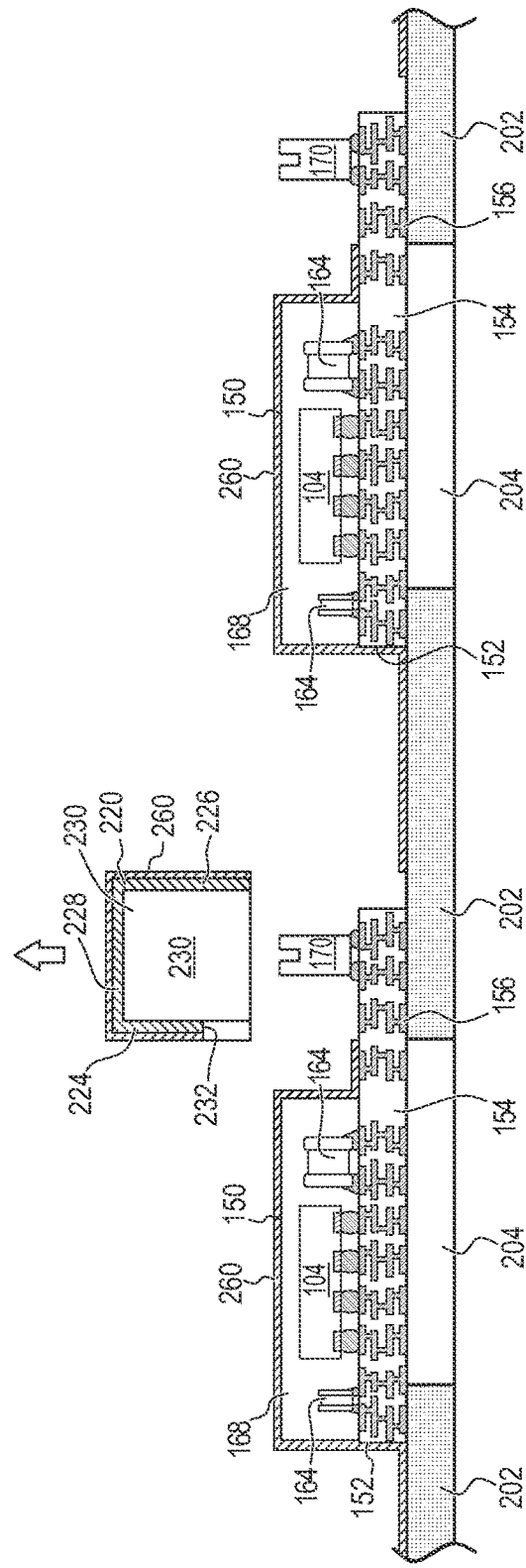

In FIG. 2l, masks 220 are removed, including the portion of shielding layer 260 formed on the masks. Masks 220 can be removed using the same pick and place machine that placed the masks in FIG. 2h or using any other suitable mechanism. With masks 220 removed, the area within frame 200 remains completely covered in shielding layer 260 other than openings in the shielding layer around connectors 170 where masks 220 had been located.

Masks 220 are reusable, so the pick and place machine places the masks into a tray or other suitable storage medium for later re-application onto the next set of packages to be shielded. Masks 220 may deteriorate after multiple uses, or have another factor that limits the number of times an individual mask can be used. Testing can be done on a particular mask design, and then each mask can be discarded after a suitable number of reuses determined via testing. A metal mask 220 can typically be reused about thirty times.

Figure 2M:
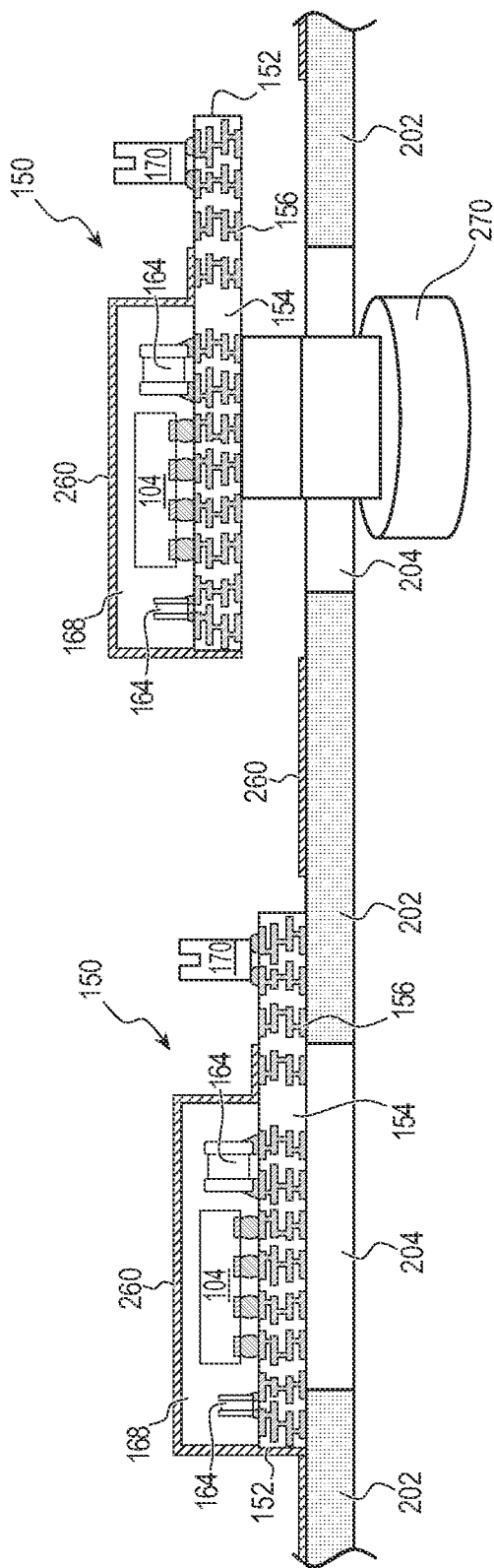

Packages 150 are unloaded from frame 200 and film 202 in FIG. 2m. An actuator 270 presses on the bottom of substrate 152 through openings 204 to release packages 150 from the adhesive of film 202. A UV light or heat can be applied to reduce the effect of the adhesive between film 202 and substrates 152. Actuator 270 can move from package to package in concert with a pick and place machine that takes the lifted package 150 and loads a JEDEC tray, tape and reel, or other similar storage medium with the shielded packages. Shielding layer 260 remains covering encapsulant 168, a portion of the side surfaces of substrate 152, and the top surface of the substrate within shielding interface area 161.

Figure 3:
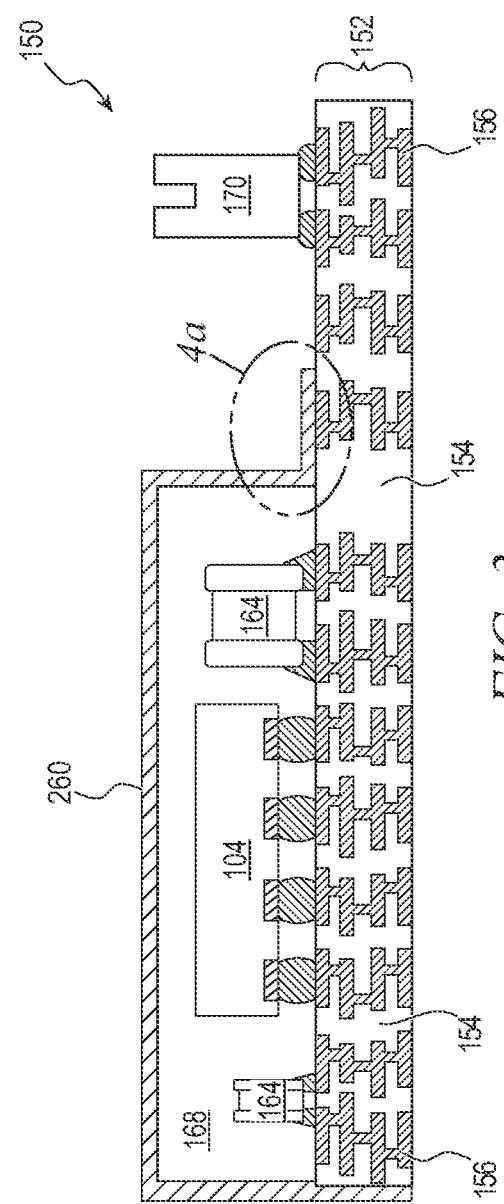
FIG. 3 illustrates a semiconductor device with the selectively formed shielding layer.

FIG. 3 shows an enlarged cross-section of a package 150. Shielding layer 260 surrounds semiconductor die 104 and discrete components 164 on all sides and on top. Shielding layer 260 extends down the side surfaces of substrate 152 within shielding region 160 and shielding interface region 161. Shielding layer 260 covers the top surface of substrate 152 within shielding interface region 161. The top surface of substrate 152 within shielding interface area 161 has exposed contact pads of conductive layer 156 that shielding layer 260 is formed directly on to provide electrical contact between the substrate and the shielding layer. Masks 220 have ensured that shielding layer 260 does not cover the portion of substrate 152 with connector 170 so that the connector remains available for later use.

In some embodiments, the bottom surface of substrate 152, opposite semiconductor die 104 and connector 170, has solder bumps or another suitable interconnect structure formed on contact pads of conductive layer 156 for attaching and connecting packages 150 to a larger PCB of an electronic device. Contact pads of conductive layer 156 can remain exposed on the bottom surface as a land grid array rather than adding another interconnect structure. While the process illustrated uses a metal frame 200 and film 202 as a carrier for packages 150 during formation of shielding layer 260, any suitable type of carrier can be used, such as a panel of glass, aluminum, steel, copper, polymer, silicon, or another suitable material.

Mask 220 has the advantages of being simple and reducing costs. Simplicity is provided by using a mask that can be placed and removed using common pick-and-place processing equipment. Cost is reduced by reusing mask 220. The overall process is streamlined by allowing non-shielded components, such as connector 170, to be disposed on substrate 152 during the same manufacturing stage as shielded components, e.g., semiconductor die 104. Prior art masking methods, e.g., tape masking, require that non-shielding area 162 remain free of components until after the shielding layer is formed and the mask is removed.

Some embodiments of package 150 rely on a direct connection between shielding layer 260 and conductive layer 156 to transfer EMI energy absorbed by the shielding layer to ground as electrical current. One issue that may diminish the current handling capacity, and thereby reduce effectiveness, in some embodiments is that the shape of substrate 152 can result in thinner sections or discontinuities of shielding layer 260.

Figure 4A:
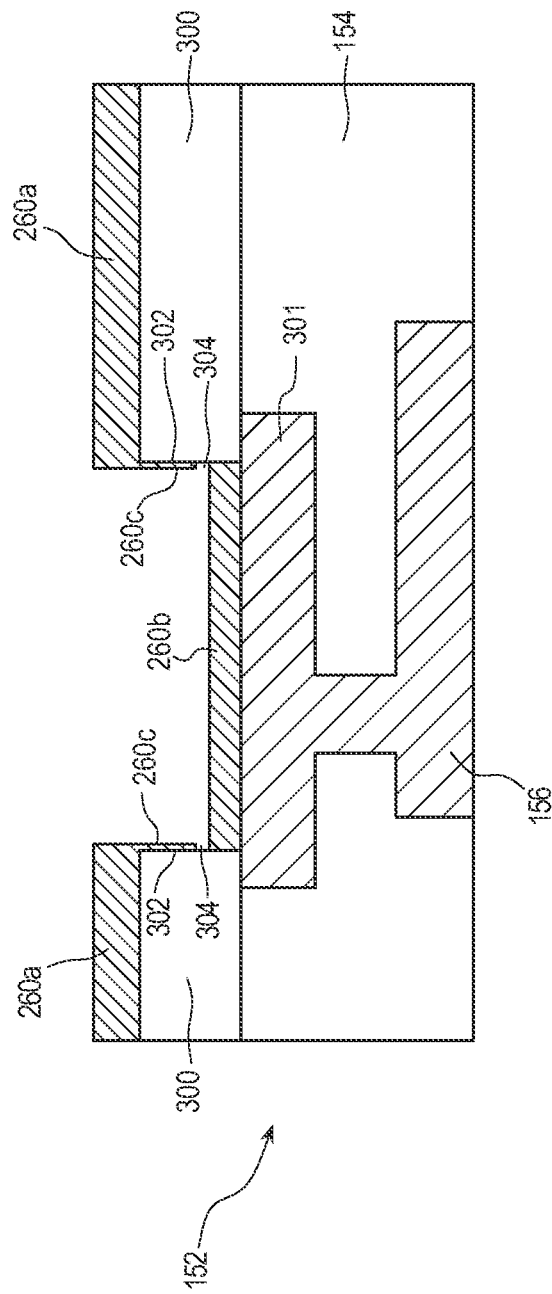
FIGS. 4a-4c illustrate increasing reliability by using sloped surfaces on the mask and semiconductor package.

FIG. 4a shows a portion of substrate 260 with a passivation or solder resist layer 300 formed over the top surface of the substrate. Passivation layer 300 includes an opening formed over an exposed contact pad 301 of conductive layer 156 to allow shielding layer 260 to physically contact the contact pad. Passivation layer 300 results in a vertical surface 302 within the opening that shielding layer 260 must conform to for electrical connection to contact pad 301.

The sputtering process can result in poor coverage on vertical surface 302. Metal atoms traveling vertically downward onto substrate 152 may provide thick coating on horizontal surfaces while not adequately coating vertical surfaces such as surface 302. FIG. 4a shows a thicker portion 260a of shielding layer 260 covering the top of passivation layer 300 and a thicker portion 260b covering the exposed contact pad 301. However, the portion 260c of shielding layer 260 covering vertical surface 302 is significantly thinner, which increases electrical resistance between conductive layer 156 and shielding layer 260. In extreme cases, discontinuities 304 can occur, which create a risk of shielding layer 260 around semiconductor die 104 not being connected to ground at all.

A solid connection to ground is critical for the operation of shielding layer 260 in some embodiments. The likelihood of vertical surface 302 being adequately covered by shielding layer 260 can be increased by following a 40-degree design rule. The 40-degree design rule requires that an area above vertical surface 302 to at least 40-degrees from vertical remains free of objects that may block sputtering molecules. While 40-degrees is used, the benefit is not completely dependent on exactly 40-degrees. Design rules utilizing between 35 and 45 degrees are used in other embodiments.

Figure 4B:
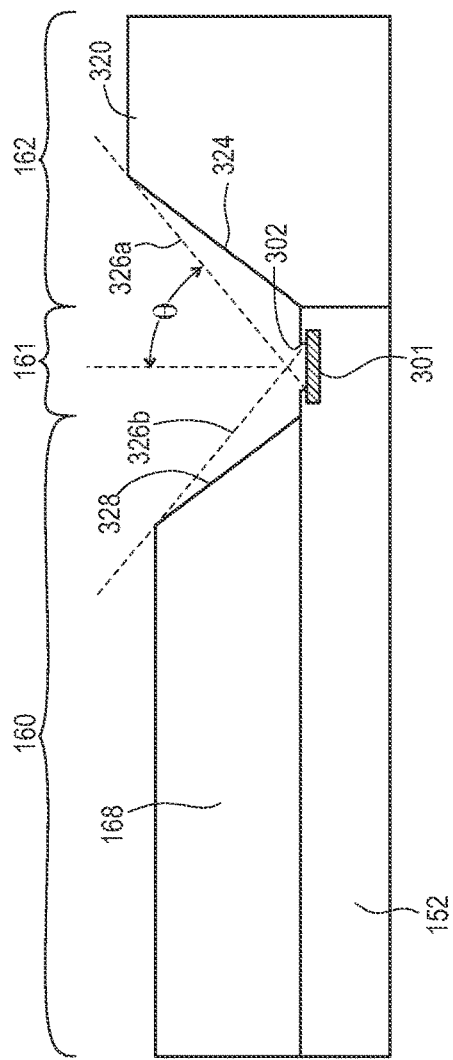
Figure 4C:
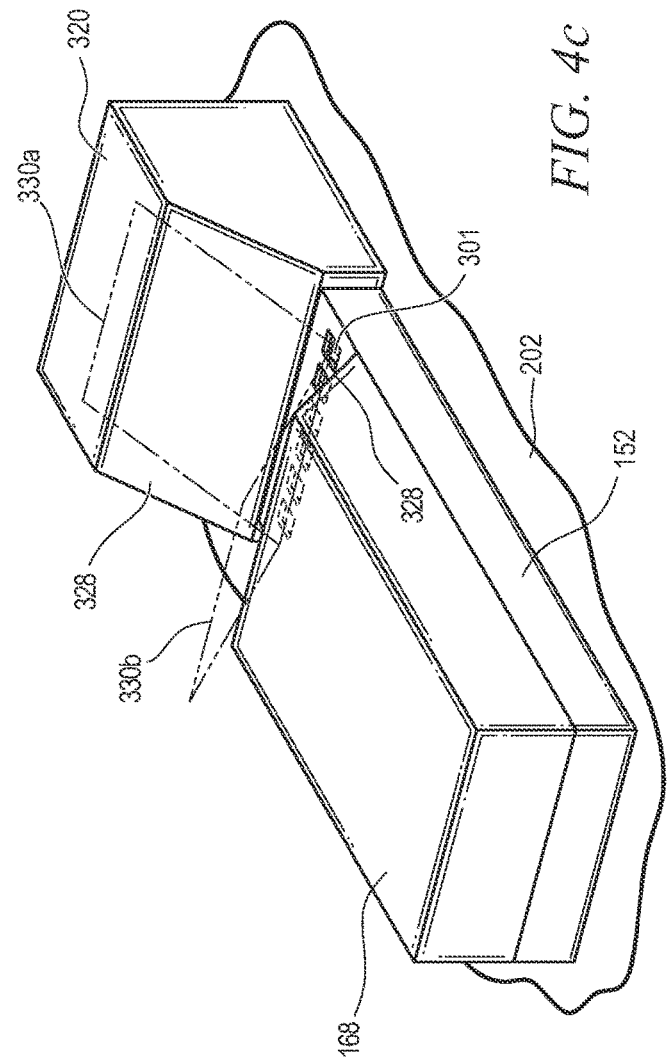

FIG. 4b illustrates a side-view of a package with the angle in question labelled as theta (θ). FIG. 4c shows a perspective of the same package. The angle θ begins at a vertical line from surface 302 and extends down to the first object hit. In the case of FIG. 4b, the object that defines angle θ is a mask 320 with a sloped front surface 324. Line 326a illustrates the line from vertical surface 302 to mask 320 that defines the angle θ. A line 326b illustrates the corresponding angle for encapsulant 168. To conform to the 40-degree rule the slope of front surface 324 is selected to ensure that the angle θ is at least 40-degrees. Whereas the vertical front 224 of mask 220 causes metal atoms to be sputtered onto contact pad 301 nearly vertically, the sloped front 324 of mask 320 allows metal atoms to approach vertical surface 302 at a 40-degree angle.

Due to the opening of passivation layer 300 being a closed circuit in plan view, the 40-degree rule applies in every direction from contact pad 301. Therefore, encapsulant 168 in FIG. 4b is also molded with a sloped or angled surface 328 oriented toward shielding interface area 161. The angle of surface 328 is formed by using a mold with the desired surface configuration, by using laser ablation to remove a portion of the encapsulant, or using any other suitable mechanism. Angled surface 328 includes an angle sufficient to satisfy the 40-degree rule for vertical surface 302 on the other side of contact pad 301, i.e., ensuring that the angle of line 326b is at least 40 degrees from vertical.

Technically, the 40-degree rule requires a cone-like volume above each contact pad in shielding interface area 161 be free of material that could block metal molecules during sputtering. For circular contact pad openings, the relevant volume would be a conic section, while other opening shapes would apply to slightly differently shaped areas. The area above a contact pad that should remain free of material is referred to as conic even if the shape is not a perfectly circular conic section. The boundary of the conic area extends at 40 degrees from the contact pad opening for 360 degrees in plan view. While technically the 40-degree rule boundary extends from the border between contact pad 301 and vertical surface 302, an area comprising a cone with a point at the center of the top surface of contact pad 301 can be used for simplicity.

In practice, the directions extending toward encapsulant 168 and non-shielding area 162 are most relevant for design consideration. Shield interface area 161 will have one or more rows of contact pads 301 extending across substrate 152, and the area to be avoided by encapsulant 168 and mask 320 will be defined by two planes 330 extending at 40 degrees from a row of contact pads.

FIG. 4c shows a plane 330a extending toward mask 320 at 40 degrees from vertical. Plane 330a extends from a row of contact pads 301 closest to mask 330a. Plane 330b extends toward encapsulant 168 at 40 degrees from vertical. Plane 330b extends from a row of contact pads 301 closest to encapsulant 168. Because planes 330a and 330b extend across their respective contact pad openings, the planes cross each other when only a single row of contact pads 301 is used. Following the 40-degree design rule requires that the volume of area between planes 330a and 330b remain free of material that could block sputtered metal.

Figure 5A:
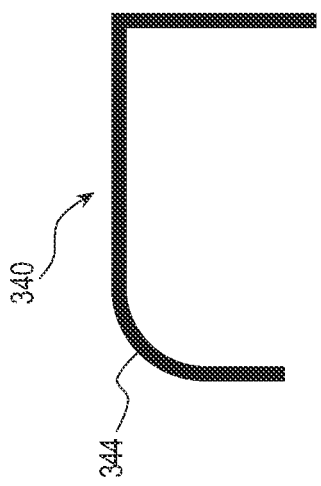
FIGS. 5a-5c illustrate alternative profiles for the preformed mask.
Figure 5B:
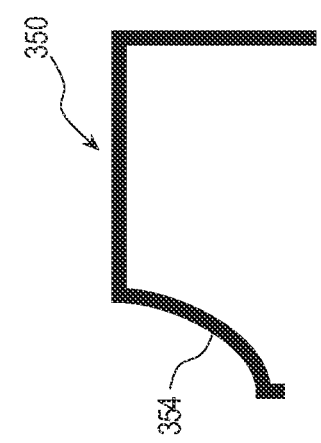
Figure 5C:
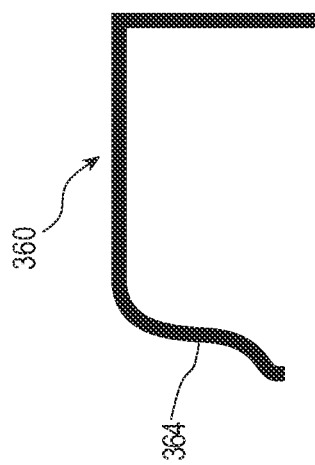

The shape of mask to comply with the 40-degree rule is not limited to a planar sloped surface 324 as with mask 320. FIGS. 5a-5c show three different non-limiting examples of mask profiles that can be used to follow the 40-degree rule. Mask 340 in FIG. 5a has a convex rounded front surface 344. The rounded profile of surface 344 cuts out the top-front corner of mask 340 relative to mask 220 to give extra clearance and fall under the 40-degree angle of plane 330a. Mask 350 in FIG. 5b has a concave rounded front surface 354. Mask 360 in FIG. 5c has an S-curved front surface 364. A mask with any suitable front surface and top surface shape can be used in other embodiments to keep a mask from intruding within the space reserved by the 40-degree rule.

Figure 6:
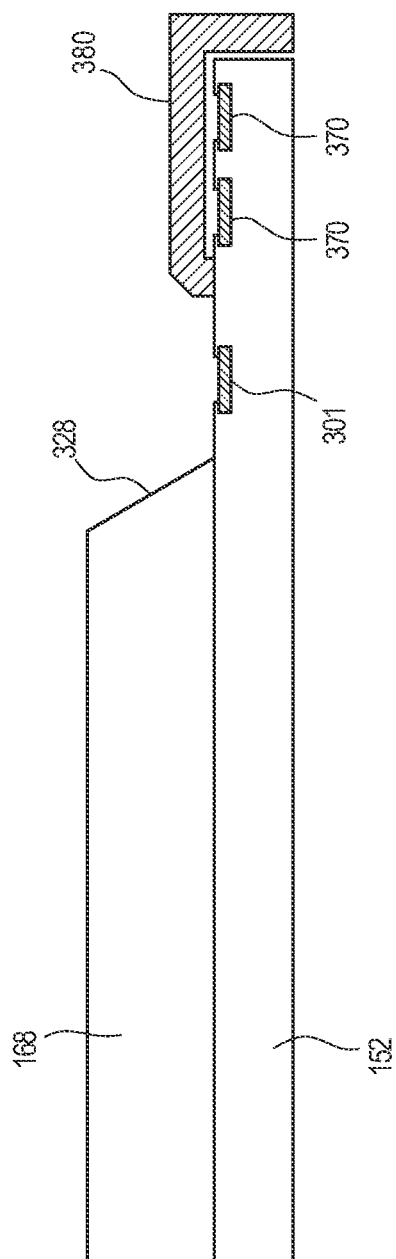
FIG. 6 illustrates a shorter mask profile.

Besides changing the shape of mask, the 40-degree rule can be more easily followed by using a mask prior to disposing components within non-shielding area 162 as shown in FIG. 6. Mask 380 can be made significantly shorter than, e.g., mask 220 because there are no components mounted on contact pads 370 of conductive layer 156 that have to fit within the mask's cavity. Mask 380 can have a top that is very close to or physically contacting substrate 152. The lower top of mask 380 means following the 40-degree rule becomes much easier, and potentially less lateral space needs to be reserved for shielding interface area 161 to ensure compliance.

The shorter mask 380 can be used while no components or only relatively short components are used in non-shielding area 162. For instance, contact pads 370 may be left empty in the final device to operate as a land grid array or the only component may be an antenna formed within substrate 152 as part of conductive layers 156. No components are disposed on substrate 152 within non-shielding area 162 so mask 380 can be made only slightly taller than the substrate. Mask 380 can also be used if the manufacturing flow is designed to keep non-shielding area 162 devoid of components prior to forming shielding layer 260 and then have the non-shielded components mounted after forming the shielding layer.

Figure 7:
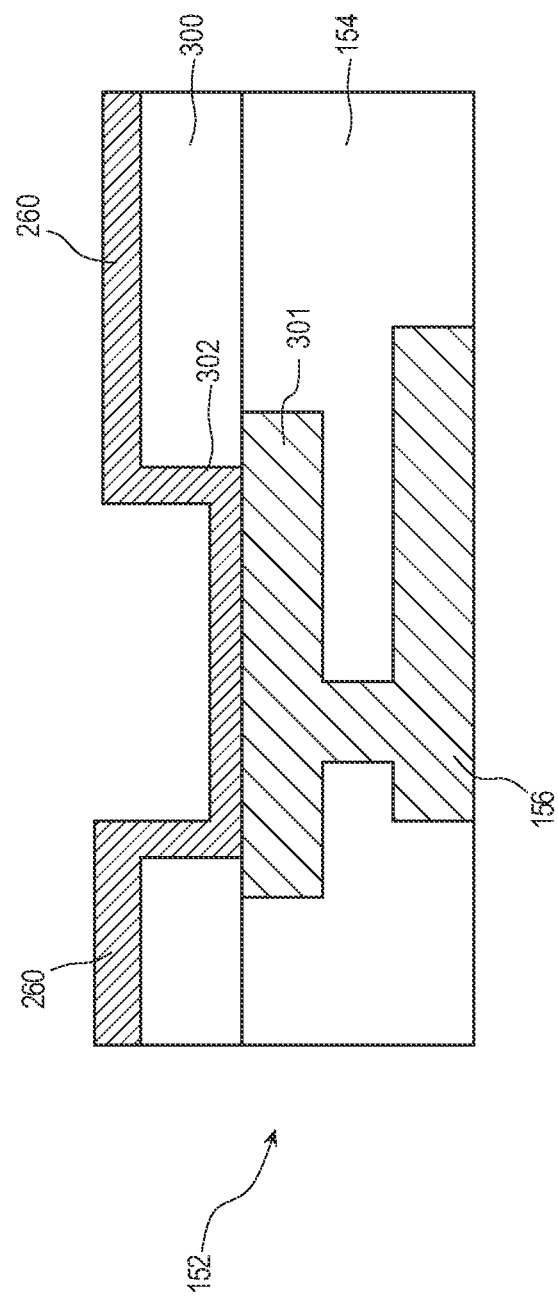
FIG. 7 illustrates a solid connection between a contact pad and the shielding layer after forming the spieling layer with a mask having a sloped surface.

FIG. 7 shows the same view from FIG. 4a after manufacturing with the 40-degree rule enforced. Shielding layer 260 forms a thick and continuous layer from on top of passivation layer 300, down vertical surface 302, and onto contact pad 301. Shielding layer 260 is well grounded and provides acceptable shielding for the components within encapsulant 168.

Figure 8A:
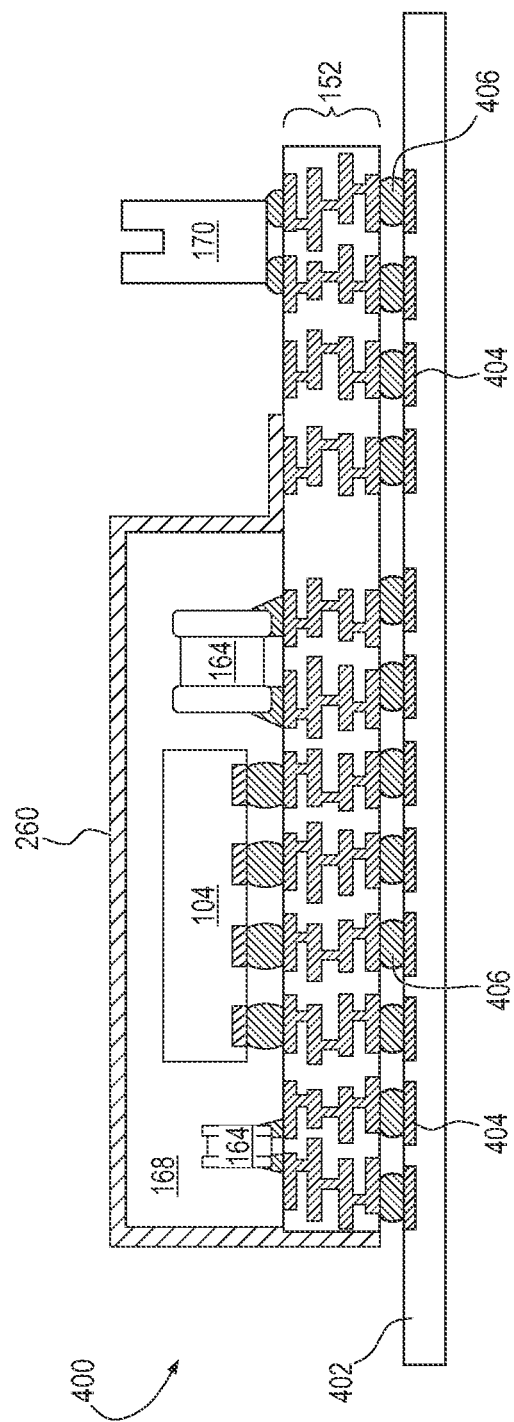
FIGS. 8a and 8b illustrate integrating the selectively shielded packages into an electronic device.
Figure 8B:
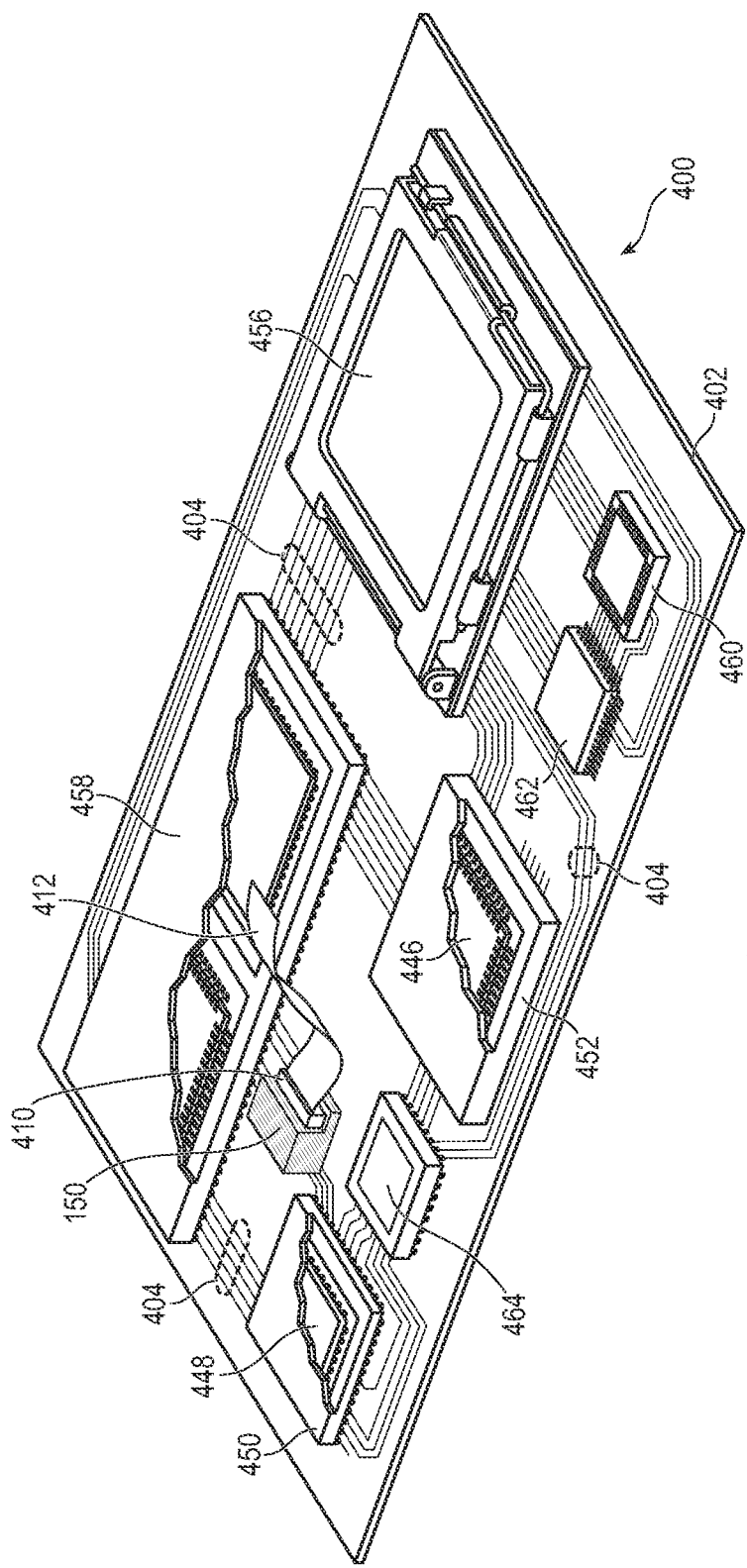

FIGS. 8a and 8b illustrate incorporating the above described shielded packages, e.g., package 150 with shielding layer 260, into an electronic device. FIG. 8a illustrates a partial cross-section of package 150 mounted onto a printed circuit board (PCB) or other substrate 402 as part of an electronic device 400. Bumps 406 are formed on conductive layer 156 on the bottom of substrate 152. Conductive bumps 406 can be formed at any stage of the manufacturing process, e.g., prior to molding encapsulant 168, prior to singulation, or after forming shielding layer 260. Bumps 406 are reflowed onto conductive layer 404 of PCB 402 to physically attach and electrically connect package 150 to the PCB. In other embodiments, thermocompression or other suitable attachment and connection methods are used. In some embodiments, an adhesive or underfill layer is used between package 150 and PCB 402. Semiconductor die 104 is electrically coupled to conductive layer 404 through substrate 152 and bumps 406.

FIG. 8b illustrates electronic device 400 including PCB 402 with a plurality of semiconductor packages mounted on a surface of the PCB, including package 150 with shielding layer 260 and connector 170. A ribbon cable 412 with connector 410 is plugged into connector 170 to electrically couple another device to the components in package 150. Connector 410 is configured to interface with connector 170 so that ribbon cable 412 can conduct electrical signals to and from package 150 through the ribbon cable. Ribbon cable 412 can be used to connect package 150 to PCB 402, another package on PCB 402, another PCB of the same or different electronic device, another package on another PCB, another electronic device, testing equipment, etc. Alternatively, other components instead of connector 170 remain exposed to provide their intended function without shielding layer 260 interfering. Electronic device 400 can have one type of semiconductor package, or multiple types of semiconductor packages, depending on the application.

Electronic device 400 can be a stand-alone system that uses the semiconductor packages to perform one or more electrical functions. Alternatively, electronic device 400 can be a subcomponent of a larger system. For example, electronic device 400 can be part of a tablet computer, cellular phone, digital camera, communication system, or other electronic device. Electronic device 400 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 8b, PCB 402 provides a general substrate for structural support and electrical interconnection of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between the semiconductor packages, mounted components, and other external systems or components. Traces 404 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 402. In other embodiments, a semiconductor device may only have the first level packaging where the die is mechanically and electrically mounted directly to PCB 402.

For the purpose of illustration, several types of first level packaging, including bond wire package 446 and flipchip 448, are shown on PCB 402. Additionally, several types of second level packaging, including ball grid array (BGA) 450, bump chip carrier (BCC) 452, land grid array (LGA) 456, multi-chip module (MCM) 458, quad flat non-leaded package (QFN) 460, quad flat package 462, and embedded wafer level ball grid array (eWLB) 464 are shown mounted on PCB 402 along with package 150. Conductive traces 404 electrically couple the various packages and components disposed on PCB 402 to package 150, giving use of the components within package 150 to other components on the PCB.

Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a semiconductor package including a substrate and an encapsulant deposited over a first portion of the substrate, wherein the encapsulant includes a sloped surface oriented toward a second portion of the substrate;
disposing a mask over the second portion of the substrate, wherein the mask includes a sloped surface oriented toward the encapsulant, and wherein an area between the sloped surface of the encapsulant and the sloped surface of the mask remains devoid of the encapsulant;
forming a shielding layer over the semiconductor package and mask; and
removing the mask after forming the shielding layer.

2. The method of claim 1, further including forming the shielding layer extending onto a contact pad of the substrate exposed between the mask and encapsulant.

3. The method of claim 2, wherein a conic area above the contact pad that extends 40 degrees from vertical remains free of the encapsulant and mask while forming the shielding layer.

4. The method of claim 1, further including reusing the mask while forming a second shielding layer over a second semiconductor package.

5. The method of claim 1, wherein the sloped surface of the mask includes a variable slope to make the surface round or curved.

6. The method of claim 1, wherein an electrical component is disposed within a cavity of the mask while forming the shielding layer.

7. A method of making a semiconductor device, comprising:
providing a semiconductor package including a substrate and an encapsulant deposited over a first portion of the substrate;
disposing a mask over a second portion of the substrate, wherein the mask includes a sloped surface oriented toward the encapsulant;
forming a shielding layer over the encapsulant and mask;
removing the mask after forming the shielding layer;
disposing the mask over a second semiconductor package; and
forming a second shielding layer over the second semiconductor package.

8. The method of claim 7, further including forming the shielding layer on a contact pad of the substrate, wherein an area above the contact pad that extends 40 degrees from vertical remains free of the mask while forming the shielding layer.

9. The method of claim 7, wherein a surface of the encapsulant oriented toward the mask is sloped.

10. The method of claim 7, wherein the sloped surface of the mask is rounded.

11. The method of claim 7, further including disposing the mask and removing the mask using a pick and place machine.

12. The method of claim 7, further including mounting a component over the second portion of the substrate after removing the mask.

13. A method of making a semiconductor device, comprising:
providing a semiconductor package;
disposing a mask over the semiconductor package using a pick and place machine, wherein a surface of the mask includes a linear or curved slope;
forming a shielding layer over the semiconductor package and mask; and
removing the mask after forming the shielding layer.

14. The method of claim 13, further including mounting a component over the substrate after removing the mask.

15. The method of claim 13, further including:
providing a second semiconductor package; and
disposing the mask over the second semiconductor package.

16. The method of claim 13, further including forming the shielding layer on a contact pad of the substrate, wherein a conic area above the contact pad remains devoid of the mask while forming the shielding layer.

17. The method of claim 16, wherein the surface of the mask is oriented toward the contact pad.

18. The method of claim 13, further including removing the mask using the pick and place machine.

19. A semiconductor device, comprising:
a substrate;
an encapsulant deposited over a first portion of the substrate, wherein the encapsulant includes a sloped surface oriented toward a second portion of the substrate;
a mask disposed over the second portion of the substrate, wherein an area above the contact pad from directly above the contact pad to 40 degrees from vertical remains devoid of the encapsulant and mask; and
a shielding layer formed over the encapsulant including on the sloped surface, wherein the shielding layer extends to a contact pad in the second portion of the substrate.

20. The semiconductor device of claim 19, further including an electronic component disposed over the second portion of the substrate.

21. The semiconductor device of claim 19, wherein the mask includes a sloped surface oriented toward the contact pad.

22. The semiconductor device of claim 19, wherein a conical area above the contact pad from directly above the contact pad to 40 degrees from vertical remains devoid of the encapsulant.

* * * * *